(12) United States Patent
Zha

(10) Patent No.: US 11,300,724 B2
(45) Date of Patent: Apr. 12, 2022

(54) LIGHT EMITTING DIODE AND BACKLIGHT MODULE USING SAME

(71) Applicant: WUHAN CHINA STAR OPTOELECTRONICS TECHNOLOGY CO., LTD., Hubei (CN)

(72) Inventor: Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 604 days.

(21) Appl. No.: 16/327,160

(22) PCT Filed: Sep. 21, 2018

(86) PCT No.: PCT/CN2018/107121
§ 371 (c)(1),
(2) Date: Feb. 21, 2019

(87) PCT Pub. No.: WO2020/047913
PCT Pub. Date: Mar. 12, 2020

(65) Prior Publication Data
US 2021/0356649 A1    Nov. 18, 2021

(30) Foreign Application Priority Data
Sep. 6, 2018 (CN) .......................... 201811039410.1

(51) Int. Cl.
*F21V 8/00*     (2006.01)
*H01L 25/075*   (2006.01)
*H01L 33/38*    (2010.01)
*H01L 33/62*    (2010.01)

(52) U.S. Cl.
CPC ......... *G02B 6/0073* (2013.01); *G02B 6/0068* (2013.01); *H01L 25/0753* (2013.01); *H01L 33/38* (2013.01); *H01L 33/62* (2013.01)

(58) Field of Classification Search
CPC . G02B 6/0073; G02B 6/0068; H01L 25/0753; H01L 33/38; H01L 33/62
See application file for complete search history.

(56) References Cited

U.S. PATENT DOCUMENTS 4,396,929 A * 8/1983 Ohki ..................... H01L 33/025
                                                257/103

FOREIGN PATENT DOCUMENTS

| CN | 102104108 A | * | 6/2011  | ........... H01L 33/486 |
| CN | 102769077 A | * | 11/2012 | ............. H01L 33/44 |
| CN | 105333334 A | * | 2/2016  |                         |
| CN | 106125402 A | * | 11/2016 |                         |

* cited by examiner

*Primary Examiner* — Mary Ellen Bowman

(57) ABSTRACT

A light emitting diode is provided. The light emitting diode includes a substrate, a first semiconductor layer disposed on the substrate, a light emitting layer disposed on a first portion of the first semiconductor layer, a second semiconductor layer disposed on the light emitting layer, a first electrode disposed on a second portion of the first semiconductor layer, the first portion and the second portion not overlapping, a second electrode disposed on the second semiconductor layer. Thickness of the first electrode is greater than thickness of the second electrode. A backlight module including the light emitting diode is further provided.

7 Claims, 4 Drawing Sheets

LIGHT EMITTING DIODE AND BACKLIGHT MODULE USING SAME

FIELD OF INVENTION

This disclosure relates to a field in liquid crystal display technology, and particularly to a light emitting diode and a backlight module using the same, ensuring uniform brightness of the backlight module.

BACKGROUND OF INVENTION

As wearable applications such as smart glasses, smart watches and the like are emerging, demand of display technology for flexible display devices is increasing. Organic light emitting display (OLED) has advantages of being self-luminous, needing no backlight, being thin in thickness, having wide viewing angles and fast response times for flexible display devices. In face of competition from flexible OLEDs, conventional liquid crystal display (LCD) technology gradually adopts flexible substrates, and is designed to make breakthroughs in flexible and curved surfaced display devices. It can be seen that an era of flexible and curved display technology is coming.

A direct-lit backlight module has an advantage of having a narrow bezel and is widely used in fields of large-sized displays, but a direct-lit backlight module has a problem of increased thickness. Adopting a small-sized light emitting diode, i.e. mini light emitting diode (mini LED) can arrange a smaller pitch in the direct-lit backlight module to obtain a smaller light-mixing distance (to avoid a hotspot at a position near a light source), and to achieve being light in weight, thin in thickness, and having a narrow bezel for the small-sized direct-lit backlight module. Because the direct-lit backlight module comprises a good many number of light-emitting diodes to form an array, the light-emitting diode and a light-emitting diode pad constitute a low-reflective body with a large low-reflection area. White oil having high-reflectivity or other highly reflective materials is usually used to cover on a region between two light-emitting diodes. The highly reflective material has comparatively low reflectivity of 70-90%, and thus overall reflection efficiency can only reach about 80%, which is much lower than that in an edge backlight module (reflection efficiency of a reflector used in the edge backlight module can achieve nearly 100%). Thus, overall lighting efficiency in the small-sized direct-lit backlight module is lower than that in the edge backlight module, and brightness and power consumption of the small-sized direct-lit backlight module are also affected. A thicker highly-reflective layer is usually used to improve reflectivity of a small-sized direct-lit backlight module.

In FIG. 1, an arrangement of a driving substrate 1 and a single mini light emitting diode 2 in a conventional backlight module is shown. A pad (not shown) of the driving substrate 1 and a p electrode/n electrode of the mini light emitting diode 2 (not shown) are connected, a periphery of the mini light emitting diode 2 is a highly reflective layer structure, and its thickness is usually between 10 micrometers to 30 micrometers. The p electrode/n electrode of the mini light-emitting diode 2 is in contact with the pad of the drive substrate 1 through a medium such as a conductive solder paste 3 or a silver paste. However, the conductive solder paste 3 is usually prepared by a coating process. After the coating process is completed, the conductive solder paste 3 has certain fluidity and surface tension in a gel state, and thus the conductive solder paste 3 forms morphology similar to "hill peak". When the mini light-emitting diode 2 contacts the conductive solder paste 3 through a die bonding process, the mini light-emitting diode 2 is easily tilted under an action of an adhesion of the conductive solder paste 3 due to the small size of the mini light-emitting diode 2, as shown in FIG. 1, thereby affecting a light reflection state of the mini light-emitting diode 2. The mini light-emitting diode 2 optically exhibits tilted, uneven brightness. In addition, because an area of the pad of the drive substrate 1 is too small, it is difficult to prevent the abovementioned phenomenon by controlling the formation of the conductive solder paste 3.

Therefore, it is necessary to provide a light emitting diode and a backlight module using the same to solve problems of uneven brightness in an inner surface of the conventional mini light-emitting diode and the conventional direct-lit backlight module thereof caused by the status between the pad and the conductive solder paste and thickness of the conductive solder paste.

SUMMARY OF INVENTION

The uneven brightness problem in an inner surface of the conventional mini light-emitting diode and the conventional direct-lit backlight module thereof is caused by the status between the pad and the conductive solder paste and a thickness of the conductive solder paste.

In order to solve the above problem, the disclosure applies a flip-chip electrode structure. A thickness of a P electrode and a thickness of an N electrode are thickened, and a metal pad composed of a low melting point metal is deposited on a pad of a driving substrate for co-melting and conducting with the pad of the driving substrate. The co-melting and conducting manner effectively prevents a tilting problem of the conventional mini light-emitting diode caused by the bonding manner between the conductive solder paste (or the silver paste) and mini light-emitting diode, and ensures a brightness uniformity of an entire surface of a backlight module. At the same time, the thickened P electrode and the thickened N electrode ensures that a height of an active area of the mini light-emitting diode can still be higher than reflective layers disposed on both sides of the mini light-emitting diode, thereby improving lighting efficiency of the backlight module in a high brightness status.

The object of this disclosure is to provide a light emitting diode. The light emitting diode comprises:
  a substrate;
  a first semiconductor layer disposed on the substrate;
  a light emitting layer disposed on a first portion of the first semiconductor layer;
  a second semiconductor layer disposed on the light emitting layer;
  a first electrode disposed on a second portion of the first semiconductor layer, the first portion and the second portion not overlapping;
  a second electrode disposed on the second semiconductor layer;
  wherein thickness of the first electrode is greater than thickness of the second electrode;
  wherein the thickness of the first electrode is equal to a sum of the thickness of the second electrode, the thickness of the second semiconductor layer, and a thickness of the light emitting layer.

According to an embodiment of the light emitting diode, the first electrode and the second electrode each has a thickness ranging from 10 micrometers to 30 micrometers.

According to an embodiment of the light emitting diode, a surface of the first electrode and a surface of the second electrode are positioned at a same height.

According to an embodiment of the light emitting diode, a first metal pad is disposed on the surface of the first electrode, a second metal pad is disposed on the surface of the second electrode, and the first metal pad and the second metal are composed of low melting point metals.

According to an embodiment of the light emitting diode, the first electrode and the second electrode are at least one selected from the group consisting of titanium, aluminum, silver, gold, copper, or an alloy thereof.

This disclosure further provides a light emitting diode. The light emitting diode comprises:
- a substrate;
- a first semiconductor layer disposed on the substrate;
- a light emitting layer disposed on a first portion of the first semiconductor layer;
- a second semiconductor layer disposed on the light emitting layer;
- a first electrode disposed on a second portion of the first semiconductor layer, the first portion and the second portion not overlapping;
- a second electrode disposed on the second semiconductor layer;
- wherein thickness of the first electrode is greater than thickness of the second electrode.

According to an embodiment of the light emitting diode, the first electrode and the second electrode each has a thickness ranging from 10 micrometers to 30 micrometers.

According to an embodiment of the light emitting diode, a surface of the first electrode and a surface of the second electrode are positioned at a same height.

According to an embodiment of the light emitting diode, a first metal pad is disposed on the surface of the first electrode, a second metal pad is disposed on the surface of the second electrode, and the first metal pad and the second metal are composed of low melting point metals.

According to an embodiment of the light emitting diode, the first electrode and the second electrode are at least one selected from the group consisting of titanium, aluminum, silver, gold, copper, or an alloy thereof.

To achieve the above object, this disclosure further provides a backlight module. The backlight module comprises:
- a driving substrate;
- a plurality of light emitting diodes disposed on the driving substrate in an array, each of the light emitting diodes comprising:
  - a substrate;
  - a first semiconductor layer disposed on the substrate;
  - a light emitting layer disposed on a first portion of the first semiconductor layer;
  - a second semiconductor layer disposed on the light emitting layer;
  - a first electrode disposed on a second portion of the first semiconductor layer, the first portion and the second portion not overlapping; and
  - a second electrode disposed on the second semiconductor layer, wherein thickness of the first electrode is greater than thickness of the second electrode; and
- a plurality of reflective blocks disposed between two adjacent ones of the light emitting diodes;
- wherein a distance between the light emitting layer and the driving substrate is greater than thickness of each of the reflective blocks.

According to an embodiment of the backlight module, the light emitting diode is a flipped chip, the first electrode is electrically connected to a first bonding pad of the driving substrate through a first metal pad, and the second electrode is electrically connected to a second bonding pad of the driving substrate through a second metal pad.

According to an embodiment of the backlight module, the first electrode and the second electrode each has a thickness ranging from 10 micrometers to 30 micrometers, and thickness of the first electrode is greater than thickness of the second electrode.

According to an embodiment of the backlight module, a spacing between the two adjacent ones of the light emitting diodes is ranging from 100 micrometers to 1000 micrometers.

According to an embodiment of the backlight module, a surface of the first electrode and a surface of the second electrode are positioned at a same height.

According to an embodiment of the backlight module, the backlight module further comprises an optical film set, the optical film set includes an optical film layer, a diffusion film layer and a brightness enhancement film layer sequentially disposed on the light emitting diodes and the reflective blocks.

According to an embodiment of the backlight module, the thickness of the first electrode is equal to a sum of the thickness of the second electrode, the thickness of the second semiconductor layer, and the thickness of the light emitting layer.

The disclosure provides a light emitting diode and a backlight module. A P electrode and N electrode used for bonding pads on the driving substrate of the backlight module in the light emitting diode are thickened. That is, thickness of the P electrode and thickness of the N electrode are increased. Moreover, a surface of the P electrode and a surface of the N electrode are positioned at a same height. Besides, metal pads are respectively provided on the surface of the thickened P electrode and on the surface of the thickened N electrode for the metal pads co-melting and conducting with the pads of the driving substrate. That effectively prevents a tilting problem of the conventional mini light-emitting diode caused by the bonding manner between the conductive solder paste (or the silver paste) and mini light-emitting diode, and ensures a brightness uniformity of an entire surface of a backlight module. Furthermore, the thickened P electrode and the thickened N electrode ensure that a light emitting layer of the light emitting diode can still be disposed above a relatively thick (about 10 micrometer to 30 micrometer) reflective block disposed between adjacent two light emitting diodes, so that a light reflection effect can be optimally applied to the mini light-emitting diode. The reflection effect ensures lighting efficiency of the backlight module in a high brightness status.

DESCRIPTION OF DRAWINGS

In order to more clearly illustrate the embodiments of the present invention or the technical solutions in the prior art, the following briefly introduces the accompanying drawings used in the embodiments. Obviously, the drawings in the following description merely show some of the embodiments of the present invention. As regards one of ordinary skill in the art, other drawings can be obtained in accordance with these accompanying drawings without making creative efforts.

DETAILED DESCRIPTION OF PREFERRED EMBODIMENTS

Figure 1:
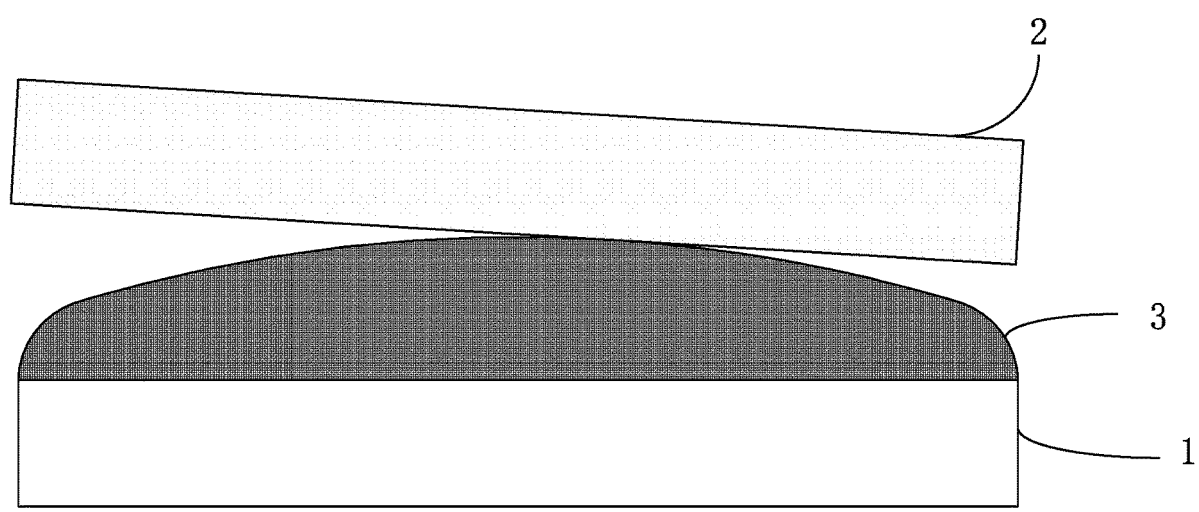
FIG. 1 is a cross-sectional structural schematic view of a conventional backlight module.

The specific details disclosed herein are merely representative and are intended to describe the purpose of the exemplary embodiments of this disclosure. This disclosure may be embodied in many and may not be construed as limited to the embodiments set forth herein.

This description of the exemplary embodiments is intended to be read in connection with the accompanying drawings, which are to be considered part of the entire written description. In the description, terms such as "lower", "upper", "horizontal", "vertical", "above", "below", "up", "down", "top", and "bottom", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar components are labeled with the same number.

Figure 2:
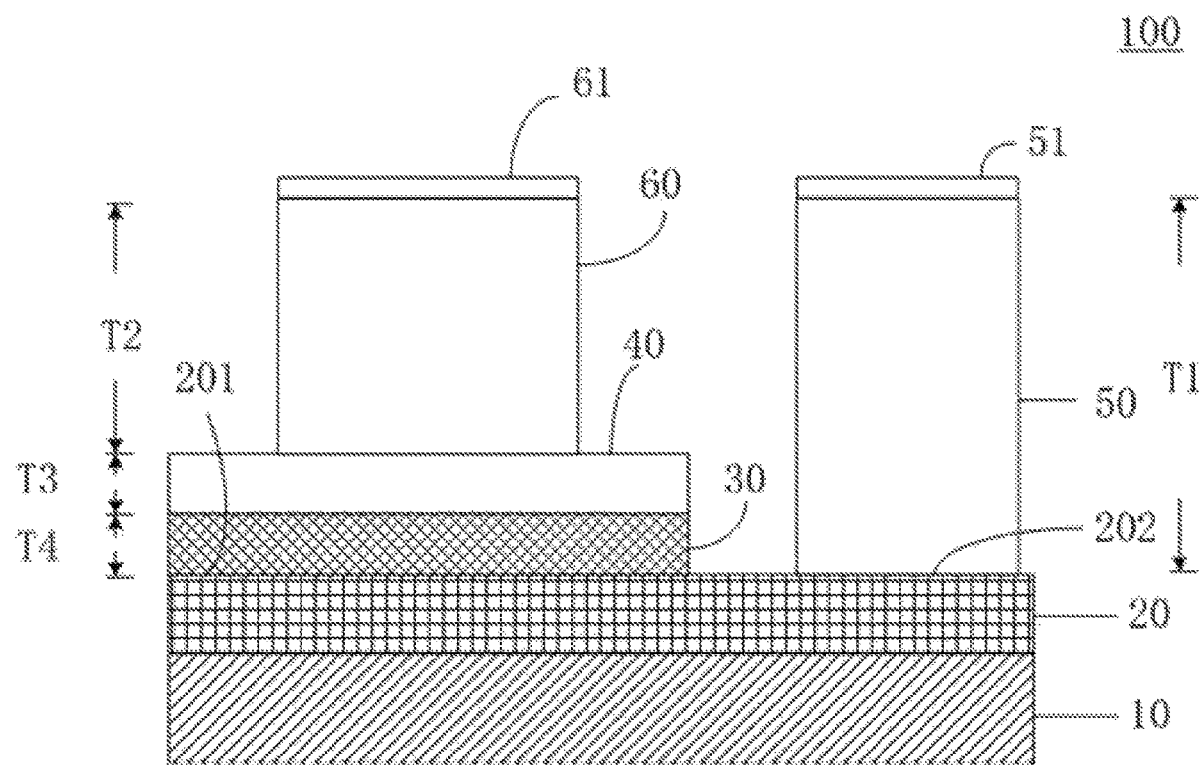
FIG. 2 is a cross-sectional structural schematic view of a light-emitting diode of the disclosure.
Figure 3:
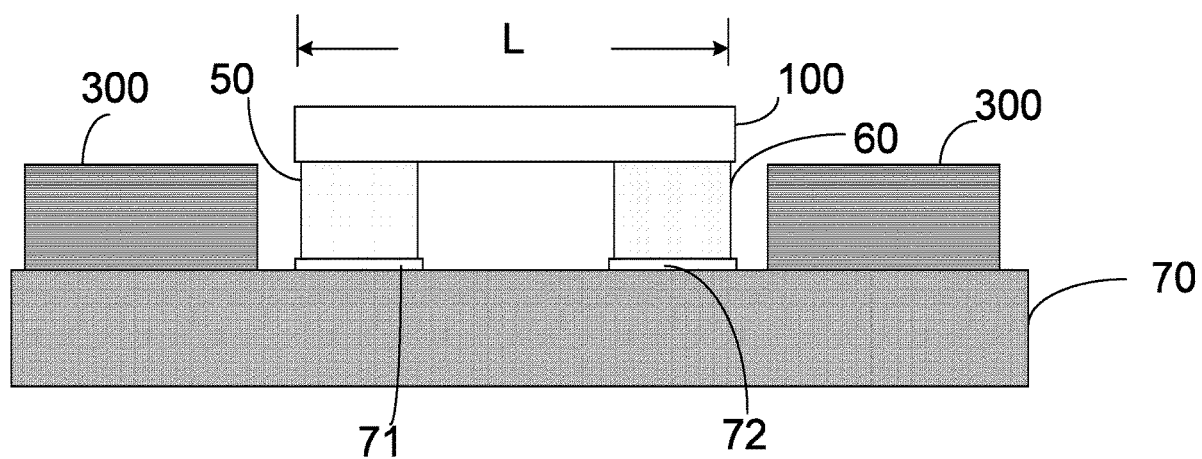
FIG. 3 is a structural schematic view of the light-emitting diode disposed on a substrate of the disclosure.

Referring to FIG. 2 and FIG. 3, structural schematic views of a light-emitting diode of the disclosure are shown. This disclosure provides a light emitting diode 100. The light emitting diode 100 comprises a substrate 10; a first semiconductor layer 20 disposed on the substrate 10; a light emitting layer 30 disposed on a first portion 201 of the first semiconductor layer 20; a second semiconductor layer 40 disposed on the light emitting layer 30; a first electrode 50 disposed on a second portion 202 of the first semiconductor layer 20, the first portion 201 and the second portion 202 not overlapping; a second electrode 60 disposed on the second semiconductor layer 40; wherein thickness of the first electrode 50 is greater than thickness of the second electrode 60.

The substrate 10 may be a FPC (Flexible Printed Circuit) or a PCB (Printed Circuit Board). For the substrate 10, any form of substrate may be used without limitation if the substrate 10 allows a light emitting structure to be disposed thereon. In certain exemplary embodiments, the substrate 10 may be a sapphire substrate, a SiC substrate, a spinel substrate, a Si substrate, or a gallium nitride substrate. In certain exemplary embodiments, the substrate 10 may have a predetermined pattern formed on its upper surface, similar to a patterned sapphire substrate (PPS).

Each of the light emitting diodes 100 can be, but not limited to, a blue chip, which is also referred as a sub-millimeter light emitting diode. The light emitting diodes 100 can also be applied to ultraviolet, red, green, white, infrared, etc., and are not described herein. The plurality of light emitting diodes 100 are arranged in an array. A light mixing distance is reduced by reducing a central spacing between the adjacent two light emitting diodes 100, and a thickness of the subsequently formed backlight module is also reduced for achieving the needs of small-sized backlight modules (less than 1 mm). The light emitting diode 100 has a width L, as shown in FIG. 3. The width L ranges from 100 micrometers to 600 micrometers. The spacing between the adjacent two light emitting diodes is from 100 microns to 1000 microns.

The first semiconductor layer 20 is an N-type semiconductor layer, and the second semiconductor layer 40 is a P-type semiconductor layer. In detail, the first semiconductor layer 20 is an N-type gallium nitride (GaN). The second semiconductor layer 40 is a P-type gallium nitride layer. In some embodiments, the first semiconductor layer 20 and the second semiconductor layer 40 include a III-V compound semiconductor, such as a nitride-based semiconductor of (Al, Ga, In). The first semiconductor layer 20 includes an n-type semiconductor layer doped with an n-type dopant such as Si, and the second semiconductor layer 40 includes a p-type semiconductor layer doped with a p-type dopant such as Mg. The light emitting layer 30 is a multiple quantum well layer (MQW).

As shown in FIG. 2 and FIG. 3, the light emitting diode 100 is a flip-chip coplanar electrode stack structure, that is, the light emitting diode 100 is a flipped chip. The light emitting layer 30 of the light emitting diode 100 is disposed on the first portion 201 of the first semiconductor layer 20, and exposes the second portion 202 of the first semiconductor layer 20, the first portion 201 and the second portion 202 do not overlap and the first portion 201 is disposed adjacent to the second portion 202. The second semiconductor layer 40 is disposed on the light emitting layer 30. Although FIG. 2 is not shown, the light emitting diode 100 further includes a buffer layer formed between the substrate 10 and the first semiconductor layer 20.

The first electrode 50 and the second electrode 60 are at least one selected from the group consisting of titanium, aluminum, silver, gold, copper, and an alloy thereof. According to various embodiments, a first metal pad 51 is disposed on a surface of the first electrode 50, and a second metal pad 61 is disposed on surface of the second electrode. The first metal pad 51 and the second metal pad 61 are composed of a low melting point metal, for example, having a melting point between 90° C. and 450° C. The low melting point metal is an alloy of tin or an element of lanthanum (In).

Figure 4:
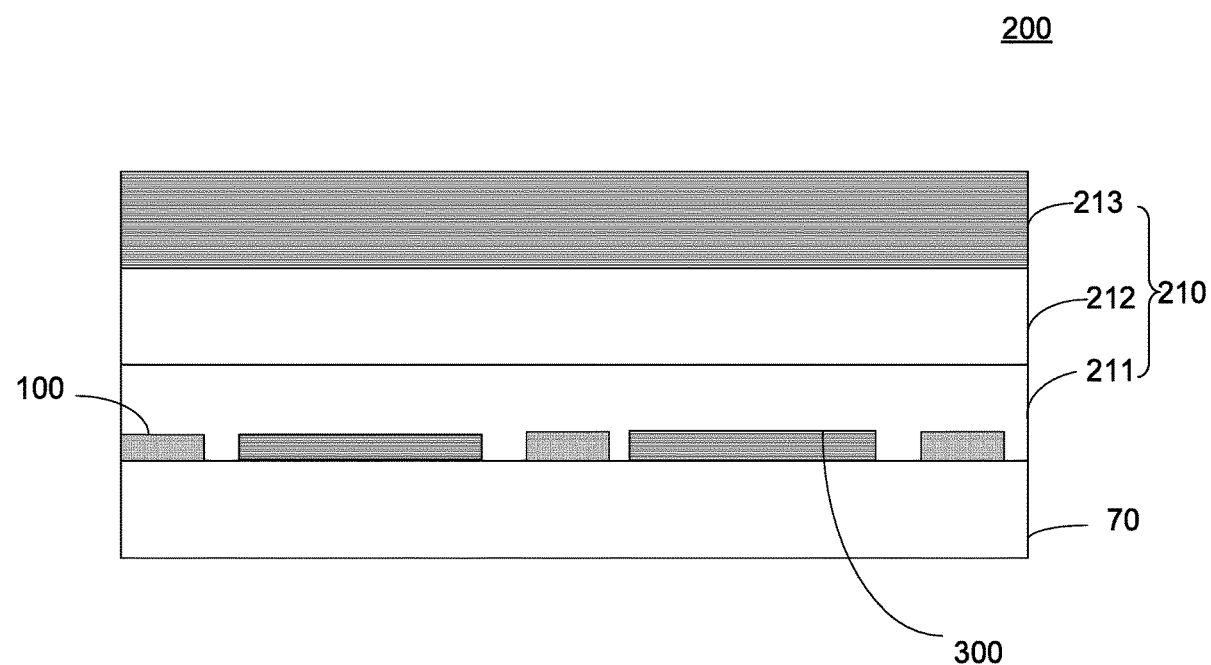
FIG. 4 is a structural schematic top view of a backlight module comprising the light-emitting diode of the disclosure.

In addition, the first electrode 50 and the second electrode 60 respectively have thickness ranging from 10 micrometers to 30 micrometers. In more detail, the first electrode 50 has a thickness T1, the second electrode 60 has a thickness T2, the second semiconductor layer 40 has a thickness T3, and the light emitting layer 30 has a thickness T4. In one embodiment, T1=T2+T3+T4, such that a surface of the first electrode 50 and a surface of the second electrode 60 are positioned at a same height. When the light emitting diode 100 is disposed on a driving substrate 70 of a backlight substrate 200 (as shown in FIG. 4), the light emitting diode 100 can be maintained in a stable state in a horizontal direction without causing the light emitting diode 100 to tilt. Besides, the light emitting diode 100 is connected to a first pad 71 and a second pad 72 on the driving substrate 70 by a die bonding process. Then, the first metal pad 51 and the second metal pad 61 having a low melting point are respectively co-fused with the first pad 71 and the second pad 72 by heating. The first metal pad 51 and the second metal pad 61 are tightly bonded with the first pad 71 and the second pad 72. The first electrode 50 and the second electrode 60 form a stable electrical connection with the first pad 71 and the second pad 72, respectively, during a cooling process of the light emitting diode 100. The first electrode 50 and the second electrode 60 are prepared by a deposition and etching process, thereby ensuring flatness of a surface of the first electrode 50 and of a surface of the second electrode 60. That effectively prevents a tilting problem of the conventional mini light-emitting diode caused by the bonding manner between the conductive solder paste (or the silver paste) and mini light-emitting diode.

In addition, referring to FIG. 4, a structural schematic top view of a backlight module comprising the light-emitting diode of the disclosure is shown. The disclosure further provides a backlight module 200 including the light emitting diode 100, so that the backlight module of the disclosure ensures uniform brightness and improves display quality when the backlight module is applied to a display.

As shown in FIG. 4, the backlight module 200 comprises a driving substrate 70, a plurality of light emitting diodes 100 disposed on the driving substrate 70 in an array. Each of the light emitting diodes 100 comprises a substrate 10, a first semiconductor layer 20 disposed on the substrate 10, a light emitting layer 30 disposed on a first portion 201 of the first semiconductor layer 20, a second semiconductor layer 40 disposed on the light emitting layer 30, a first electrode 50 disposed on a second portion 202 of the first semiconductor layer 20, the first portion 201 and the second portion 202 not overlapping, and a second electrode 60 disposed on the second semiconductor layer 40. Thickness of the first electrode 50 is greater than thickness of the second electrode 60 and a plurality of reflective blocks 300 disposed between two adjacent ones of the light emitting diodes 100.

In addition, the backlight module 200 further comprises an optical film set 210, the optical film set 210 includes an optical film layer 211, a diffusion film layer 212, and a brightness enhancement film layer 213 sequentially disposed on the light emitting diodes 100 and the reflective blocks 300. The optical film layer 211 is in the form of a film. In other preferred embodiments, the optical film layer 211 is directly coated on a surface of the light emitting diode. The optical film layer 211 contains phosphor particles and scattering particles, and preferably contains quantum dot particles or the like.

As described above, light emitting diode LED 100 is a flip chip, and the first electrode 50 is electrically connected to the first pad 71 of the driving substrate 70 through a first metal pad 51 (as shown in the FIG. 3), and the second electrode 60 is electrically connected to the second pad 72 of the driving substrate 70 (shown in FIG. 3) through the second metal pad 61. the light emitting diode 100 is connected to the first pad 71 and the second pad 72 on the driving substrate 70 by a die bonding process. Then, the first metal pad 51 and the second metal pad 61 having a low melting point are respectively co-fused with the first pad 71 and the second pad 72 by heating. The first metal pad 51 and the second metal pad 61 are tightly bonded with the first pad 71 and the second pad 72. The first electrode 50 and the second electrode 60 form a stable electrical connection with the first pad 71 and the second pad 72, respectively, during a cooling process of the light emitting diode 100. The first electrode 50 and the second electrode 60 are prepared by a deposition and etching process, thereby ensuring flatness of a surface of the first electrode 50 and a surface of the second electrode 60. That effectively prevents a tilting problem of the conventional mini light-emitting diode caused by the bonding manner between the conductive solder paste (or the silver paste) and mini light-emitting diode.

Moreover, a distance between the light emitting layer 30 and the driving substrate 70 is greater than thickness of each of the reflective blocks 300. It is ensured that a position of the light-emitting layer 30 in a vertical direction can be higher than that of the reflective block 300. That is, the position of the light-emitting layer 30 in the vertical direction is above the reflective block 300 (or reflective layer), so that a light reflection effect can be optimally applied to five light-emitting sides of the light-emitting diode. The reflection effect ensures lighting efficiency of the backlight module in a high brightness status.

The disclosure provides a light emitting diode and a backlight module comprising the light emitting diode. A first electrode and a second electrode used for bonding a first pad and a second pad on a driving substrate of the backlight module in the light emitting diode are thickened. That is, thickness of the first electrode and thickness of the second electrode are increased. Moreover, a surface of the first electrode and a surface of the second electrode are positioned at a same height. Besides, metal pads are respectively provided on a surface of the thickened first electrode and on a surface of the thickened second electrode for the metal pads co-melting and conducting with the first pad and the second pad of the driving substrate. That effectively prevents a tilting problem of the conventional mini light-emitting diode caused by the bonding manner between the conductive solder paste (or the silver paste) and mini light-emitting diode, and ensures a brightness uniformity of an entire light-emitting surface of a backlight module. Furthermore, the thickened first electrode and the second electrode ensure that a light emitting layer of the light emitting diode can still be maintained above the reflective block disposed between the adjacent two light emitting diodes in a vertical direction. The height of the light emitting layer is above a reflective layer so that light path of the light emitting diode is not blocked by the reflective block. Therefore, a light reflection effect can be optimally applied to five light-emitting sides of the light-emitting diode. The reflection effect ensures lighting efficiency of the backlight module in a status of high brightness.

This disclosure has been described with preferred embodiments thereof, and it is understood that many changes and modifications to the described embodiment can be carried out without departing from the scope and the spirit of the disclosure that is intended to be limited only by the appended claims.

The invention claimed is:

1. A backlight module, comprising:
   a driving substrate;
   a plurality of light emitting diodes disposed on the driving substrate in an array, each of the light emitting diodes comprising:
   a substrate;
   a first semiconductor layer disposed on the substrate;
   a light emitting layer disposed on a first portion of the first semiconductor layer;
   a second semiconductor layer disposed on the light emitting layer;
   a first electrode disposed on a second portion of the first semiconductor layer, the first portion and the second portion not overlapping; and
   a second electrode disposed on the second semiconductor layer, wherein thickness of the first electrode is greater than thickness of the second electrode; and
   a plurality of reflective blocks disposed between two adjacent ones of the light emitting diodes;
   wherein a distance between the light emitting layer and the driving substrate is greater than thickness of each of the reflective blocks.

2. The backlight module according to claim 1, wherein the light emitting diode is a flipped chip, the first electrode is electrically connected to a first bonding pad of the driving substrate through a first metal pad, and the second electrode is electrically connected to a second bonding pad of the driving substrate through a second metal pad.

3. The backlight module according to claim 1, wherein the first electrode and the second electrode each has a thickness ranging from 10 micrometers to 30 micrometers, and thickness of the first electrode is greater than thickness of the second electrode.

4. The backlight module according to claim 1, wherein a spacing between the two adjacent ones of the light emitting diodes ranges from 100 micrometers to 1000 micrometers.

5. The backlight module according to claim 1, wherein a surface of the first electrode and a surface of the second electrode are positioned at a same height.

6. The backlight module according to claim 1, wherein the backlight module further comprises an optical film set, the optical film set includes an optical film layer, a diffusion film layer and a brightness enhancement film layer sequentially disposed on the light emitting diodes and the reflective blocks.

7. The backlight module according to claim 1, wherein thickness of the first electrode is equal to a sum of thickness of the second electrode, the second semiconductor layer, and the light emitting layer.

\* \* \* \* \*